United States Patent
Ludwig et al.

(10) Patent No.: US 9,312,616 B2
(45) Date of Patent: Apr. 12, 2016

(54) PLUG CONNECTION HAVING A GUIDE ELEMENT OPTIMIZED FOR PREVENTING SHAVINGS

(71) Applicants: Dieter Ludwig, Ludwigsburg (DE); Reiner Herold, Stuttgart (DE)

(72) Inventors: Dieter Ludwig, Ludwigsburg (DE); Reiner Herold, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/283,963

(22) Filed: May 21, 2014

(65) Prior Publication Data

US 2014/0349511 A1 Nov. 27, 2014

(30) Foreign Application Priority Data

May 22, 2013 (DE) ..................... 10 2013 209 435 U

(51) Int. Cl.
  *H01R 13/648* (2006.01)
  *H01R 12/70* (2011.01)
  *H05K 3/30* (2006.01)
  *H01R 13/41* (2006.01)
  *H01R 13/631* (2006.01)
  *H01R 12/75* (2011.01)

(52) U.S. Cl.
  CPC ............ *H01R 12/7005* (2013.01); *H01R 13/41* (2013.01); *H01R 13/631* (2013.01); *H05K 3/303* (2013.01); *H01R 12/75* (2013.01); *H05K 2201/10318* (2013.01); *H05K 2201/10424* (2013.01); *H05K 2203/167* (2013.01); *Y02P 70/613* (2015.11); *Y10T 29/49147* (2015.01)

(58) Field of Classification Search
  CPC .... H01R 12/7005; H01R 12/75; H01R 13/41; H01R 13/631; H05K 2201/10318; H05K 2201/10424; H05K 2203/167; H05K 3/303; Y10T 29/49147
  USPC ............................................ 439/78, 374, 770
  See application file for complete search history.

(56) References Cited

U.S. PATENT DOCUMENTS

| | | | | |
|---|---|---|---|---|
| 5,015,946 A | * | 5/1991 | Janko | G01R 1/0425 324/72.5 |
| 6,155,856 A | * | 12/2000 | Sanada | H01R 9/091 439/246 |
| 6,743,053 B2 | * | 6/2004 | Wu | H01R 13/506 439/357 |
| 6,790,051 B1 | * | 9/2004 | Secall | H01R 9/091 174/260 |
| 7,234,950 B1 | * | 6/2007 | Wickett | H01R 13/504 439/247 |
| 2004/0014338 A1 | * | 1/2004 | Takai | H01R 13/6315 439/78 |
| 2009/0053914 A1 | * | 2/2009 | Ma | H01R 12/89 439/83 |
| 2010/0099279 A1 | * | 4/2010 | Homme | H01R 13/5202 439/78 |
| 2011/0233907 A1 | * | 9/2011 | Struchholz | G01L 19/0084 280/735 |
| 2015/0077959 A1 | * | 3/2015 | Loibl | H01R 12/58 361/760 |

* cited by examiner

*Primary Examiner* — Abdullah Riyami
*Assistant Examiner* — Nader J Alhawamdeh
(74) *Attorney, Agent, or Firm* — Kenyon & Kenyon LLP

(57) ABSTRACT

A plug connector set-up for a control unit includes: a pin support having a pin; and a guide element having a lead-through for positioning the pin at a circuit board of the control unit. The lead-through has an entrance opening on the side facing the pin support and an outlet opening on the side facing away from the pin support. A diameter of the entrance opening is greater than a diameter of the outlet opening. The pin includes a centering region having a diameter which is less than the diameter of the entrance opening and greater than the diameter of the outlet opening.

14 Claims, 4 Drawing Sheets

PLUG CONNECTION HAVING A GUIDE ELEMENT OPTIMIZED FOR PREVENTING SHAVINGS

BACKGROUND OF THE INVENTION

1. Field of the Invention

The present invention relates to a plug connection having a guide a guide element.

2. Description of the Related Art

Motor vehicles may provide a multitude of safety, comfort and informational functions. To this end, different actuators and sensors may be positioned at or in the motor vehicles. A control unit provided in the motor vehicle may, for example, receive and process signals from the sensors and output control signals to the actuators. The more functions provided in a motor vehicle, the greater the demands may be on a control unit, which controls these functions. In particular, a number of electrical lines, which are used for exchanging data and signals between the control unit and sensors and actuators, increases.

In order to allow, for example, assembly, maintenance or repair of the control unit, the lines are generally not rigidly connected to the control unit, but are releasably attached to the control unit via a plug connection. To this end, a plurality of contact elements in the form of, for example, a circuit board having soldering eyelets, are provided on the control unit. In the interior of the control unit, the contact elements may be wired to corresponding signal and data lines leading to, for example, control components or data processing components of the control unit.

In this context, the contact elements on the control unit may interact, for example, with complementary counter-contact elements or pins, which are provided, for example, in a plug connector, e.g., at the end of a wiring harness. In order to produce an electrically conductive connection between the control unit and the lines of the wiring harness, the pins should be positioned as accurately as possible on the contact elements of the control unit. To this end, a guide element may be provided for the pins. However, when the pins are led through the guide element, the pins, in particular, the tin coating of the pins, may be damaged. In addition, the shavings formed may result in contamination of the contact elements.

BRIEF SUMMARY OF THE INVENTION

Thus, there is a need for an improved plug connector set-up and a corresponding manufacturing method for a plug connector set-up, which allow, in particular, damage to pins and, possibly, contamination of the contact elements, to be prevented.

In the following, features, details and possible advantages of a device according to specific embodiments of the present invention are discussed in detail.

According to a first aspect of the present invention, a plug connector set-up for a control unit is put forward. The plug connector set-up includes a pin support having a pin. In addition, the plug connector set-up includes a guide element having a lead-through for positioning the pin on a circuit board of the control unit. In this context, the lead-through includes an entrance opening on the side facing the pin support and an outlet opening on the side of the guide element facing away from the pin support. In this context, a diameter of the entrance opening is greater than a diameter of the outlet opening. In addition, the pin includes a centering region. In this instance, a diameter of the centering region is less than the diameter of the entrance opening and greater than the diameter of the outlet opening.

In other words, the idea of the present invention is based on the idea of providing a centering region in the form of a protuberance on the pin and thereby concentrating the alignment function of the pin on this region. In this manner, the alignment of the pin in all three spatial directions may be optimized. Furthermore, the formation of shavings or glitter, which is caused, for example, by the rubbing of the tip of the pin on the inner walls of the lead-through during mounting of the guide element at the pin support, may be prevented.

The plug connector set-up of the present invention may be used, for example, on control units of a motor vehicle, in particular, of a hybrid or electric vehicle.

The pin support may also be referred to as a multipoint plug. In this context, the pin support includes at least one pin and preferably a plurality of pins. The pins may include, in particular, a zinc layer or tin coating at the tip of the pin, in order to improve the electrical conductivity and/or soldering capability.

The guide element may also be referred to as a guideway and has at least one lead-through. The guide element preferably includes a plurality of lead-throughs, which corresponds, for example, to the plurality of pins on the pin support. The lead-throughs or openings of the guide element are used for leading the pins through in the direction of the circuit board, on which the contact elements of the control unit are situated. The contact elements may be manufactured, for example, as soldering eyelets.

The pin support and the guide element may include, for example, plastic, or be made of plastic. In particular, the guide element and, if indicated, the pin support as well, may be injection-molded.

Each of the lead-throughs includes an entrance and outlet opening. In this context, the guide element is installed at the pin support in such a manner, that the outlet opening is situated on the side facing away from the pin support and the entrance opening is situated on the side facing the pin support.

The diameter of the entrance opening, which is also referred to as a first diameter, may be, for example, approximately 2 mm. In this context, the diameter of the outlet opening is less than the diameter of the entrance opening. In this instance, the diameter of the outlet opening may be referred to as a second diameter and be approximately 1 mm. That is, the lead-through narrows in the insertion direction of the pin.

The centering region provided on the pin may be manufactured, for example, as a protuberance of the pin. In this context, a diameter of the centering region, which is also referred to as a third diameter, may lie between the first and the second diameter. For example, the diameter of the centering region may be at least 1.2 mm.

The centering region may be constructed so as to have a diameter that varies along the longitudinal axis of the pin. In this case, the minimum diameter or the smallest diameter of the centering region is greater than the diameter of the outlet opening and less than the diameter of the entrance opening.

By shaping the pin to include a protuberance, the lead-through may be constructed to be wider between the centering region and the outlet opening, than in the case of guide elements, in which the lead-through directly interacts with the functional region of the pin in order to center the pin. By this means, a lead-through may be constructed to be wider, in particular, in the region of the outlet opening, than in the case of known guide elements. In this manner, the tin-coated tip of the pin may be at a greater distance from the inner wall of the lead-through during centering. Consequently, the formation of tin shavings from the rubbing of the pin on the inner wall of the lead-through may be prevented. In addition, the positional accuracy of the pin in all three spatial directions may be improved thanks to the centering region.

According to one exemplary embodiment of the present invention, the pin includes a functional region, which is configured to contact the circuit board. In this instance, a diameter of the functional region is less than the diameter of the centering region and less than the diameter of the outlet opening.

The functional region may be tinned, for example, that is, covered with a tin layer. In this context, the tinning is used for producing a more effective electrical contact. The diameter of the functional region may be referred to as a fourth diameter. For example, the fourth diameter may be 0.6 mm.

Due to the shaping of the pin to have a centering region and a functional region that is, in comparison, considerably thinner at the tip of the pin, the borehole of the outlet opening may be constructed to be considerably larger than in the case of previous guide elements. In contrast to the plug connector set-up of the present invention, in known guide elements, the region of the outlet opening has been used for centering, which means that a very narrow outlet opening has been required. By shaping the outlet opening to have a diameter considerably greater than the diameter of the functional region of the pin, contact between the inner wall of the lead-through and the tin-coated functional region of the pin may be prevented.

According to a further exemplary embodiment of the present invention, the centering region of the pin is constructed to be trapezoidally shaped in a plane parallel to the longitudinal axis of the pin. In this context, an inclination of sides of the trapezoid corresponds to an inclination of inner walls of the lead-through, at least in one region of the lead-through.

In this instance, the trapezoidal shape of the centering region may taper in the insertion direction of the pin. In particular, the centering region may be implemented as a trapezoid having legs of equal length. By constructing the centering region as a trapezoid, in which an inclination of the trapezoid legs corresponds to the inclination of the inner walls of the lead-through, the centering region rests on or against a larger surface on the inner wall of the lead-through. This allows more optimal centering of the pin in all three spatial directions. In particular, thanks to the trapezoidal design of the centering region, play-free centering of the pin is rendered possible.

According to a further exemplary embodiment of the present invention, the lead-through runs conically between the entrance opening and a region, whose diameter corresponds to the diameter of the centering region. In addition, the lead-through includes a cylindrical region between the outlet opening and the region, whose diameter corresponds to the diameter, that is, the minimum diameter, of the centering region. The conical region of the lead-through may also be referred to as a plug-in funnel.

The diameter of the lead-through, which corresponds to the minimum diameter of the centering region, may also be referred to as a fifth diameter. Thus, the entrance opening facing the pin support has the greatest diameter of the lead-through. This tapers conically up to the location of the lead-through, which corresponds to the minimum diameter of the centering region. From there on out, the lead-through runs cylindrically to the outlet opening. In this manner, a wider insertion region for the pin of the pin support may be initially provided. Afterwards, after the centering, a sufficiently wide duct for the functional region of the pin is available, so that no shavings are produced by the functional region of the pin rubbing on the inner walls of the lead-through.

According to a further exemplary embodiment of the present invention, the outlet opening has a rounded-off edge. In this context, constructing the outlet opening to have a rounded-off edge may aid in preventing the buildup of tin shavings at the outlet opening.

For example, when the guide element is injection-molded, the rounded-off edge may be produced by a specially formed mold. In contrast to conventional guide elements, in which the mold flash runs radially with respect to the pin and produces a sharp edge, the mold separation flash is produced to run tangentially to the pin.

According to a further exemplary embodiment of the present invention, an elastic collar, which protrudes outwards from the guide element in a direction parallel to a longitudinal axis of the pin, is provided at the outlet opening.

This means that thanks to the appropriate design of the injection-molding process and the mold by which the lead-throughs are produced, an elastic collar may be provided on the guide element. In this context, the elastic collar protrudes outwards on the side of the guide element facing away from the pin support. Due to its shaping as a thin plastic layer, the elastic collar may be manufactured to be elastic. In particular, the elastic collar is formed in one piece or integrally with the guide element. In this instance, the collar may include a rounded-off edge. In addition, the elastic collar aids in preventing a build-up of tin shavings, which may produce, for example, short-circuits at the circuit board of the control unit.

According to a second aspect of the present invention, a control unit having an above-described plug connector set-up is put forth. The control unit may be installed, for example, in a motor vehicle.

According to a third aspect of the present invention, a method for manufacturing an above-described plug connector set-up is put forth. The method has the following steps: providing a pin support having a pin; providing a guide element having a lead-through for positioning the pin on a circuit board; providing the lead-through with an entrance opening on the side facing the pin support and an outlet opening on the side facing away from the pin support; providing a centering region on the pin. In this context, a diameter of the entrance opening is greater than a diameter of the outlet opening. In addition, in this instance, a diameter of the centering region is less than the diameter of the entrance opening and greater than the diameter of the outlet opening.

Additional features and advantages of the present invention will become clear to one skilled in the art from the following description of exemplary embodiments, with reference to the attached drawing. However, the exemplary embodiments should not be interpreted as limiting to the present invention.

DETAILED DESCRIPTION OF THE INVENTION

Figure 1:
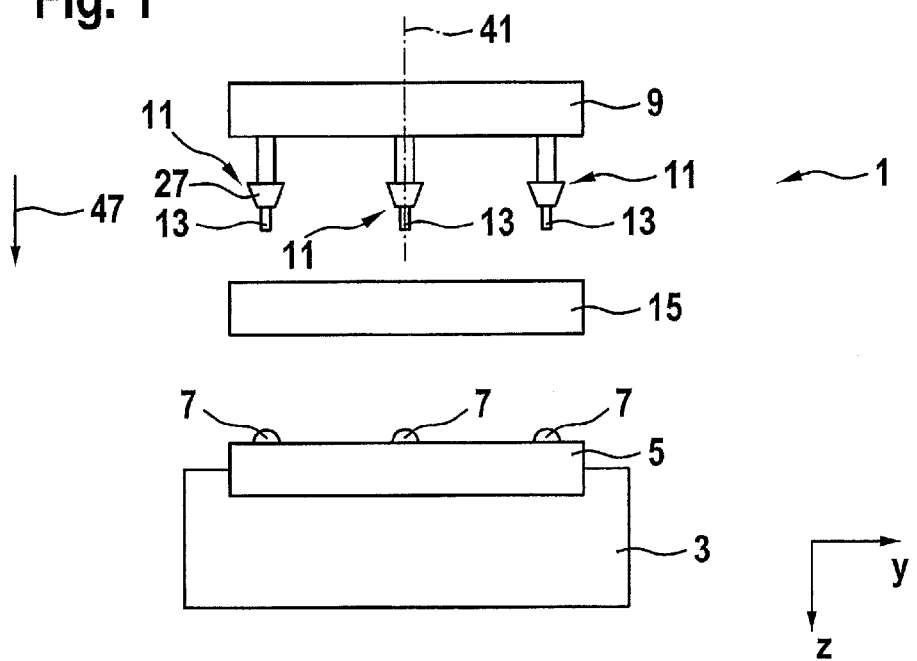
FIG. 1 shows a schematic side view of a control unit having a plug connector set-up according to an exemplary embodiment of the present invention.

All of the figures are merely schematic representations of devices according to the present invention, and of their components according to exemplary embodiments of the present invention. In particular, distances and size relationships are not represented true to scale in the figures. In the various figures, corresponding elements are provided with the same reference numerals.

A highly schematic side view of a control unit having a plug connector set-up 1 is illustrated in FIG. 1. Control unit 3 includes a circuit board 5. Electrical contact elements in the form of soldering eyelets 7 are provided on circuit board 5. In order to produce an electrical connection between circuit board 5 and, for example, a pin support 9, which is provided with pins 11 and is on a wire harness, pins 11 are positioned on soldering eyelets 7. In order to ensure exact positioning of pins 11 on soldering eyelets 7, a guide element 15 in the form of a guideway is provided. As shown in FIGS. 2 through 6, guide element 15 includes lead-throughs 17, at which pins 11 are aligned with respect to circuit board 5 and, in particular, to soldering eyelets 7. In this context, the alignment may be carried out in both insertion direction 47, i.e., in the z-direction, and in an xy-plane, that is, perpendicular to insertion direction 47.

Figure 2:
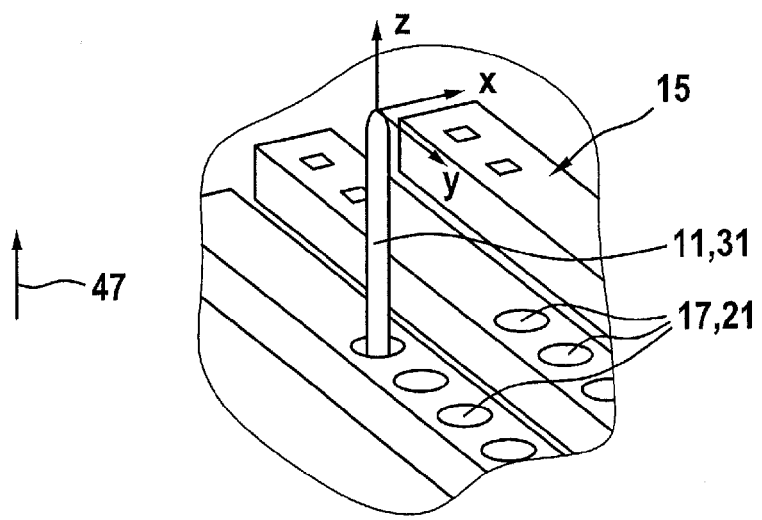
FIG. 2 shows a perspective plan view of a side of the guide element facing away from the pin support.

A perspective plan view of guide element 15 is illustrated in FIG. 2. In this context, FIG. 2 shows a side of guide element 15 facing away from pin support 9. That is, FIG. 2 shows the side of guide element 15 facing circuit board 5. In this instance, lead-throughs 17 and outlet openings 21 of lead-throughs 17 are visible.

Figure 3A:
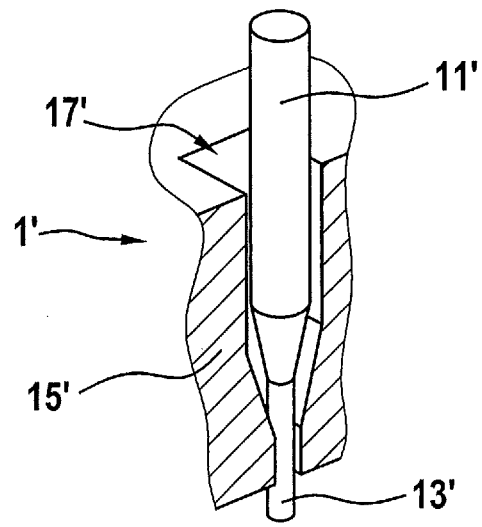
FIG. 3A shows a perspective sectional view of a known plug connector.

A perspective sectional view of a known plug connector 1' is illustrated in FIG. 3A. In this context, guide element 15' is provided with a lead-through opening 17', into which pin 11' is inserted. In this instance, pin 11' is centered by the narrow shape of lead-through 17'. In this context, a tin layer 13' at the tip of the pin may be damaged by the friction at the inner walls of lead-through 17'. The tin glitter or shavings formed may produce short-circuits on the circuit board.

Figure 3B:
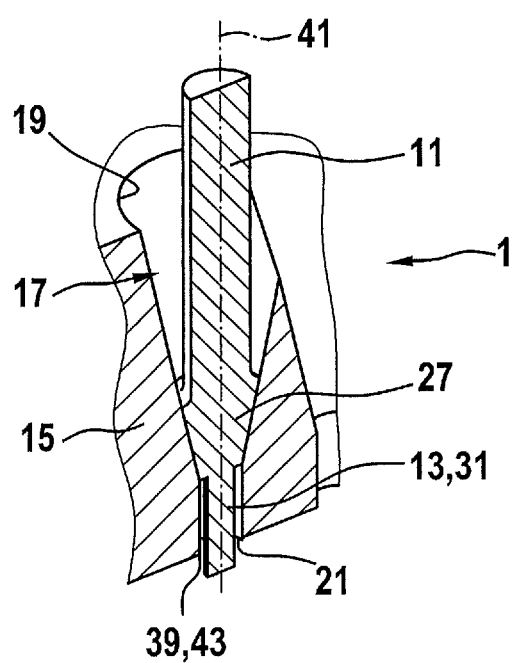
FIG. 3B shows a perspective sectional view of a plug connector set-up according to an exemplary embodiment of the present invention.

A perspective sectional view of a plug connector set-up 1 according to the present invention is represented in FIG. 3B. In contrast to the known plug connector 1' shown in FIG. 3A, pin 11 is centered according to a different principle. In particular, pin 11 has a centering region 27 and a functional region 31 provided with a tin layer 13. Entrance opening 19 of lead-through 17 has a first diameter 23. In addition, outlet opening 21 of guide element 15 has a second diameter 25. In this instance, first diameter 23 is greater than second diameter 25. In addition, centering region 27 of pin 11 has a minimum diameter, which is referred to as a third diameter 29. Furthermore, functional region 31 has a diameter, which is also referred to as fourth diameter 33. In this context, the fourth diameter is substantially smaller than second diameter 25 of the outlet opening. In this instance, diameters 23, 25, 29, 33 are drawn into FIG. 4.

In comparison with the known plug connector 1' shown in FIG. 3A, the region of outlet opening 21 in plug connector set-up 1 of the present invention is designed to be considerably wider. In this manner, the build-up of tin shavings during the mounting of guide element 15 to pin support 9 may be prevented. In addition, a higher positional accuracy may be achieved in all three spatial directions.

Figure 4:
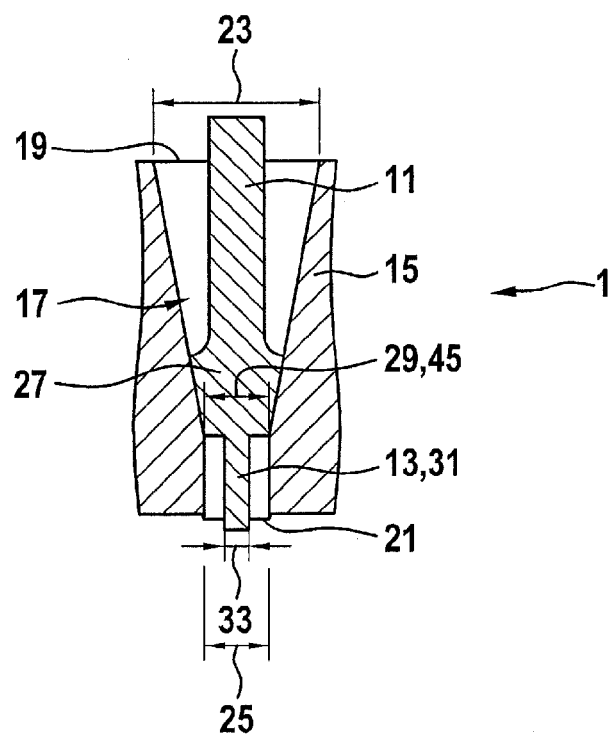
FIG. 4 shows a cross-sectional view of the plug connector set-up illustrated in FIG. 3B.
Figure 5:
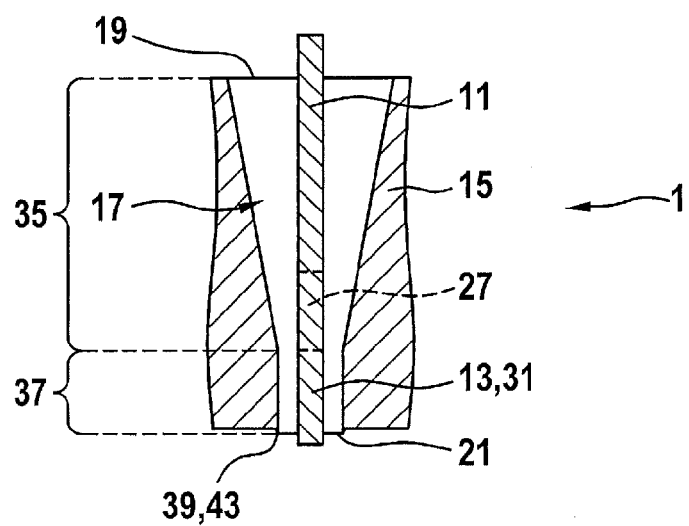
FIG. 5 shows a cross-sectional view of the plug connector set-up illustrated in FIG. 3B, displaced by 90° with respect to the representation of FIG. 4.

FIG. 4 shows a cross-sectional view, along longitudinal axis 41 of pin 11, of the plug connector set-up illustrated in FIG. 3B. FIG. 5 also shows a cross-sectional view, along longitudinal axis 41 of pin 11, of the plug connector set-up illustrated in FIG. 3B. In this context, the section in FIG. 5 is rotated by 90° with respect to the representation in FIG. 4. That is, the cross section in FIG. 4 could run in a zy-plane, while the cross section in FIG. 5 runs in an xz-plane.

As shown in FIGS. 3B through 6, centering region 27 of pin 11 is trapezoidally shaped. In this instance, the inclination of the trapezoid legs corresponds to the inclination of the inner walls of lead-through 17. In this manner, play-free positioning of pin 11 may be achieved.

In this context, as shown in FIG. 5, lead-through 17 includes a conical region 35 and a cylindrical region 37. In this instance, conical region 35 runs between entrance opening 19 and a region of lead-through 17, whose diameter, which is also referred to as fifth diameter 45, corresponds to diameter 29 of centering region 27. In addition, lead-through 17 runs cylindrically from this point to outlet opening 21, that is, with a constant diameter. In this manner, a wide through-hole may be provided for pin 11, so that upon insertion, as shown, for example, in FIG. 6, it has little or no contact with the inner walls of lead-through 17.

Further prevention of the build-up of shavings may be achieved by forming outlet opening 21 to have a rounded-off edge 39. This may be effected, for example, by the selection of the viscosity of the raw material of guide element 15, and by the selection of the injection-molding dies.

Figure 6:
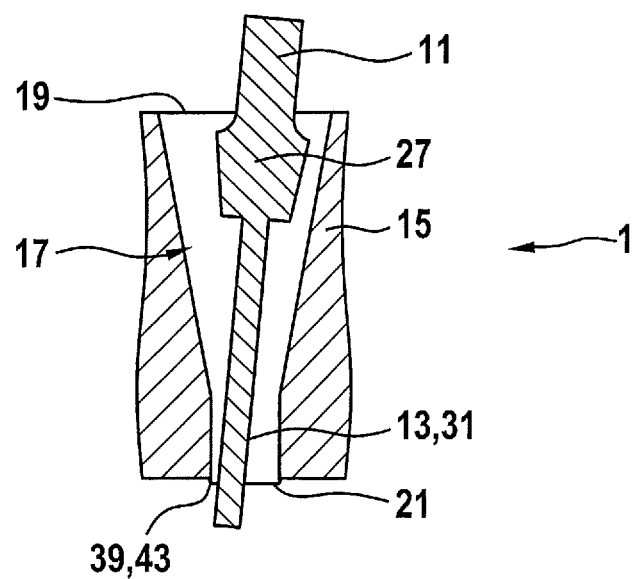
FIG. 6 shows the plug connector set-up of FIG. 4, upon insertion of the pin into the guide element.

In addition, as illustrated in FIGS. 5 and 6, an elastic collar 43 may be provided at outlet opening 21. In this context, elastic collar 43 runs parallel to a longitudinal axis 41 of pin 11 and protrudes outwards from outlet opening 21. Furthermore, elastic collar 43 aids in preventing a build-up of tin shavings. The pin 11 shown in FIG. 6 has a longer functional region 31 than the pin 11 shown in FIG. 4. That is, in the inserted state, the functional region 31 in FIG. 6 projects further from outlet opening 21 than the pin 11 illustrated in FIG. 4.

In closing, it is noted that terms such as "having" or similar ones shall not preclude additional elements or steps from being able to be provided. Furthermore, it should be pointed out that the article "a" or "an" does not exclude a plurality. Moreover, features described in connection with the various specific embodiments may be combined with one another in any way.

What is claimed is:

1. A plug connector set-up for a control unit, comprising:
a pin support having a pin; and
a guide element having a lead-through for positioning the pin on a circuit board of the control unit;
wherein the lead-through has an entrance opening on a side facing the pin support and an outlet opening on a side facing away from the pin support, a diameter of the entrance opening being greater than a diameter of the outlet opening, and wherein the pin includes a centering region having a diameter less than the diameter of the entrance opening and greater than the diameter of the outlet opening, and wherein the centering region is in the form of a protuberance on the pin so as to concentrate the alignment function of the pin on this region, so that the alignment of the pin in all three spatial directions is optimized.

2. The plug connector set-up as recited in claim 1, wherein the pin has a functional region which is configured to contact the circuit board, and wherein a diameter of the functional region is less than the diameter of the centering region.

3. The plug connector set-up as recited in claim 1, wherein the centering region of the pin is formed in the shape of a trapezoid, in a plane parallel to the longitudinal axis of the pin, and wherein an inclination of legs of the trapezoid corresponds to an inclination of inner walls of the lead-through.

4. The plug connector set-up as recited in claim 1, wherein the lead-through runs conically between the entrance opening and a region having a diameter which corresponds to the diameter of the centering region, and wherein the lead-through includes a cylindrical region between the outlet opening and the region having the diameter which corresponds to the diameter of the centering region.

5. The plug connector set-up as recited in claim 2, wherein the outlet opening has a rounded-off edge.

6. The plug connector set-up as recited in claim 1, wherein an elastic collar which protrudes outwards from the guide element in a direction parallel to a longitudinal axis of the pin is provided at the outlet opening.

7. The plug connector set-up as recited in claim 4, wherein the plug connector set-up is part of a control unit.

8. A method for manufacturing a plug connector set-up, the method comprising:
  providing a pin support having a pin;
  providing a guide element having a lead-through for positioning the pin on a circuit board;
  providing the lead-through with an entrance opening on a side facing the pin support and an outlet opening on a side facing away from the pin support, wherein a diameter of the entrance opening being greater than a diameter of the outlet opening; and
  providing a centering region on the pin, a diameter of the centering region being less than the diameter of the entrance opening and greater than the diameter of the outlet opening;
  wherein the centering region is in the form of a protuberance on the pin so as to concentrate the alignment function of the pin on this region, so that the alignment of the pin in all three spatial directions is optimized.

9. The plug connector set-up as recited in claim 8, wherein the pin has a functional region which is configured to contact the circuit board, and wherein a diameter of the functional region is less than the diameter of the centering region.

10. The plug connector set-up as recited in claim 8, wherein the centering region of the pin is formed in the shape of a trapezoid, in a plane parallel to the longitudinal axis of the pin, and wherein an inclination of legs of the trapezoid corresponds to an inclination of inner walls of the lead-through.

11. The plug connector set-up as recited in claim 8, wherein the lead-through runs conically between the entrance opening and a region having a diameter which corresponds to the diameter of the centering region, and wherein the lead-through includes a cylindrical region between the outlet opening and the region having the diameter which corresponds to the diameter of the centering region.

12. The plug connector set-up as recited in claim 9, wherein the outlet opening has a rounded-off edge.

13. The plug connector set-up as recited in claim 8, wherein an elastic collar which protrudes outwards from the guide element in a direction parallel to a longitudinal axis of the pin is provided at the outlet opening.

14. The plug connector set-up as recited in claim 11, wherein the plug connector set-up is part of a control unit.

\* \* \* \* \*